United States Patent
Lin et al.

(10) Patent No.: US 12,288,960 B2
(45) Date of Patent: Apr. 29, 2025

(54) METHOD AND SYSTEM FOR CONTROL OF LASER EMISSIONS FOR SAFETY

(71) Applicant: Quanta Computer Inc., Taoyuan (TW)

(72) Inventors: Chang-Sheng Lin, Taoyuan (TW); Hsiao-Hsien Weng, Taoyuan (TW); Zong-Syun He, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 18/659,591

(22) Filed: May 9, 2024

(65) Prior Publication Data

US 2024/0291225 A1    Aug. 29, 2024

Related U.S. Application Data

(63) Continuation of application No. 17/154,847, filed on Jan. 21, 2021, now Pat. No. 12,009,630.
(Continued)

(51) Int. Cl.
*H01S 3/13* (2006.01)
*G02B 6/42* (2006.01)
(Continued)

(52) U.S. Cl.
CPC .......... *H01S 3/1305* (2013.01); *G02B 6/4246* (2013.01); *H01S 5/0261* (2013.01);
(Continued)

(58) Field of Classification Search
CPC .... H01S 3/1305; H01S 5/0261; H01S 5/0617; H01S 5/06825; H01S 5/0683; G02B 6/4246
See application file for complete search history.

(56) References Cited

U.S. PATENT DOCUMENTS 7,062,177 B1   6/2006   Grivna et al.
7,787,767 B2*  8/2010   Wang ................... H04B 10/40
                                                  398/33
(Continued)

OTHER PUBLICATIONS

JP Office Action for Application No. 2021-148601, mailed Oct. 25, 2022, w/ Office Action Summary.
(Continued)

*Primary Examiner* — Yuanda Zhang
(74) *Attorney, Agent, or Firm* — NIXON PEABODY LLP

(57) ABSTRACT

A system and method for safe use of an optics assembly with an external light source and an optically coupled optics module is disclosed. The system includes an external light module emitting a continuous wave laser through an output port. An optics module has an input port and a memory. The optics module generates a modulated optical signal. The memory stores the power level of the continuous wave laser signal received by the optics module. An optical jumper is provided for coupling the output port with the input port. A communication bus is coupled between a controller and the external light source module. The controller sets the external light source at a low power level and transitions the external light source to a high power level when the stored power level of the continuous wave laser signal received by the optics module exceeds a predetermined level.

21 Claims, 9 Drawing Sheets

Related U.S. Application Data

(60) Provisional application No. 63/089,235, filed on Oct. 8, 2020.

(51) Int. Cl.
*H01S 5/026* (2006.01)
*H01S 5/06* (2006.01)
*H01S 5/068* (2006.01)
*H01S 5/0683* (2006.01)

(52) U.S. Cl.
CPC ........ *H01S 5/0617* (2013.01); *H01S 5/06825* (2013.01); *H01S 5/0683* (2013.01)

(56) References Cited

U.S. PATENT DOCUMENTS

| | | |
|---|---|---|
| 12,009,630 B2 * | 6/2024 | Lin ................ H01S 5/0683 |
| 2003/0095303 A1 | 5/2003 | Cunningham et al. |
| 2016/0277098 A1 | 9/2016 | Decker et al. |
| 2018/0109348 A1 | 4/2018 | Salsi |

OTHER PUBLICATIONS

TW Office Action for Application No. 110125428, mailed Feb. 25, 2022, w/ First Office Action Summary.

* cited by examiner

| Byte | Bit | Name | Description | Type |
|---|---|---|---|---|
| 128 | 7-0 | CW Power MSB | Internally measured CW(Continous Wave) optical power: unsigned iteger in 10μW increments, yielding a total measurement range of 0 to 655.35 mW (~-20 to +28.16dBm) | RO |
| 129 | 7-0 | CW Power LSB | | RO |
| 130 | 7-0 | CW optical power monitor for Laser safety high alarm threshold MSB | Laser safety threshold for CW(Continous Wave) optical power monitor: unsigned integer in 10μW increments, yielding a total measurement range of 0 to 655.35 mW (~-20 to +28.16dBm) | RO |
| 131 | 7-0 | CW optical power monitor for Laser safety high alarm threshold LSB | | RO |
| 132 | 7-0 | CW optical power monitor for Laser safety Low alarm threshold MSB | | RO |
| 133 | 7-0 | CW optical power monitor for Laser safety Low alarm threshold LSB | | RO |
| 134 | 7-0 | CW optical power monitor for Laser safety high warning threshold MSB | | RO |
| 135 | 7-0 | CW optical power monitor for Laser safety high warning threshold LSB | | RO |
| 136 | 7-0 | CW optical power monitor for Laser safety Low warning threshold MSB | | RO |
| 137 | 7-0 | CW optical power monitor for Laser safety Low warning threshold LSB | | RO |

FIG. 3A

| 138 | 7 | CW optical power monitor for Laser safety high alarm | CW(Continuous Wave) optical power high alarm for Laser safety. Clear on Read | RO |
|---|---|---|---|---|
| | 6 | CW optical power monitor for Laser safety low alarm | CW(Continuous Wave) optical power Low alarm for Laser safety. Clear on Read | RO |
| | 5 | CW optical power monitor for Laser safety high warning | CW(Continuous Wave) optical power high Warning for Laser safety. Clear on Read | RO |
| | 4 | CW optical power monitor for Laser safety Low warning | CW(Continuous Wave) optical power Low Warning for Laser safety. Clear on Read | RO |
| | 3 | CW optical power monitor for Laser safety high alarm Mask | Masking bit for CW(Continuous Wave) optical power for Laser safety High alarm | RO |
| | 2 | CW optical power monitor for Laser safety Low alarm Mask | Masking bit for CW(Continuous Wave) optical power for Laser safety Low alarm | RO |
| | 1 | CW optical power monitor for Laser safety high warning Mask | Masking bit for CW(Continuous Wave) optical power for Laser safety High Warning | RO |
| | 0 | CW optical power monitor for Laser safety Low warning Mask | Masking bit for CW(Continuous Wave) optical power for Laser safety Low Warning | RO |
| 139 | 7-0 | CW optical power monitor for Normal operation high alarm threshold MSB | Normal operation threshold for CW(Continuous Wave) optical power monitor: unsigned integer in 10µW increments, yielding a total measurement range of 0 to 655.35 mW \ (~-20 to +28.16dBm) | RO |

FIG. 3B

| | | | | |
|---|---|---|---|---|
| 140 | 7-0 | CW optical power monitor for Normal operation high alarm threshold LSB | Normal operation threshold for CW(Continous Wave) optical power monitor: unsigned integer in 10μW increments, yielding a total measurement range of 0 to 655.35 mW (~-20 to +28.16dBm) | RO |
| 141 | 7-0 | CW optical power monitor for Normal operation Low alarm threshold MSB | | RO |
| 142 | 7-0 | CW optical power monitor for Normal operation Low alarm threshold LSB | | RO |
| 143 | 7-0 | CW optical power monitor for Normal operation high warning threshold MSB | | RO |
| 144 | 7-0 | CW optical power monitor for Normal operation high warning threshold LSB | | RO |
| 145 | 7-0 | CW optical power monitor for Normal operation Low warning threshold MSB | | RO |
| 146 | 7-0 | CW optical power monitor for Normal operation Low warning threshold LSB | | RO |
| 147 | 7 | CW optical power monitor for Normal operation high alarm | CW(Continous Wave) optical power high alarm for Normal operation. Clear on Read | RO |

FIG. 3C

| | | | |
|---|---|---|---|
| | 6 | CW optical power monitor for Normal operation Low alarm | CW(Continous Wave) optical power Low alarm for Normal operation. Clear on Read | RO |
| | 5 | CW optical power monitor for Normal operation high warning | CW(Continous Wave) optical power high Warning for Normal operation. Clear on Read | RO |
| | 4 | CW optical power monitor for Normal operation Low warning | CW(Continous Wave) optical power Low Warning for Normal operation. Clear on Read | RO |
| | 3 | CW optical power monitor for Normal operation high alarm Mask | Masking bit for CW(Continous Wave) optical power for Normal operation High Alarm | RO |
| | 2 | CW optical power monitor for Normal operation Low alarm Mask | Masking bit for CW(Continous Wave) optical power for Normal operation Low Alarm | RO |
| | 1 | CW optical power monitor for Normal operation high warning Mask | Masking bit for CW(Continous Wave) optical power for Normal operation high Warning | RO |
| | 0 | CW optical power monitor for Normal operation Low warning Mask | Masking bit for CW(Continous Wave) optical power for Normal operation Low Warning | RO |
| 148~255 | 7-0 | Reserved | - | - |

| # | Host System Actions | ELS(External Light Source) module Actions | ELS(External Light Source Module) State Machine/Mode |
|---|---|---|---|
| 1 | Host configures ELS's LowerPwrS to FALSE to initiate a module transition to Laser Safety Mode | | ModuleLowPwr/ Low Power Mode |
| | | Module see LowPwrS transition signal become FALSE and transitions to LaserSafetyInit | |
| | | Module starts to enable the laser bias current | LaserSafetyInit |
| 2 | Host checks the ELS's module state machine | Module state machine into LaserSafety and stabilizing the laser output power at lower power | LaserSafety/ Laser Safety Mode |
| | | Wait for host action | |
| 3 | Host checking the CPO module's CW power reading is over power threshold or not | | |
| 4 | Host configures ELS's Laser SafetyS to FALSE to initiate a module transition to High Power Mode | Module see LaserSafetyS transition signal become FALSE and transitions to ModulePwrUp | |
| | | Module increases the bias current to High Power Mode | ModulePwrUp |
| 5 | Host waits for IntL assertion to indicate completion of transition to High Power Mode | Module sets the Module State Changed flag to 1 on entry into ModuleReady and stabilizing the laser output power at higher power | ModuleReady/ High Power Mode |
| 6 | Host detects assertion of IntL and reads all interrupt flag registers, which deasserts IntL | | |

FIG. 5

METHOD AND SYSTEM FOR CONTROL OF LASER EMISSIONS FOR SAFETY

CROSS-REFERENCE TO RELATED APPLICATIONS

This application is a continuation of U.S. patent application Ser. No. 17/154,847 filed Jan. 21, 2021, which has been allowed; U.S. patent application Ser. No. 17/154,847 claims priority from and benefit of U.S. Provisional Patent Application Ser. No. 63/089,235, filed on Oct. 8, 2020, titled "The Laser Safety of the ELS (External Light Source) Module By Firmware Control," all of which are hereby incorporated by reference herein in their entireties.

TECHNICAL FIELD

The present disclosure relates generally to optical signal generation systems. More particularly, aspects of this disclosure relate to a routine that controls an external light source to limit laser emission power during a power-up cycle to protect an operator from being exposed to full laser emission.

BACKGROUND

Optical systems are being employed for high speed data transmissions in application such as switches for data or telephonic communications. For example, an optical switch may route optical signals from fiber optic cables that are transmitted and received by networked devices. Optical signals are faster and have greater bandwidth than electrical signals transmitted by well known wire cables. An optical switch is based on a co-packaged optics assembly that includes a high-density organic substrate, a switch integrated circuit, and optical modules. Each of the optical modules has three fiber arrays. One of the fiber arrays transmits optical signals, and a second one receives optical signals. The third fiber array is optically connected to an external light source module. The external light source module emits a continuous wave laser output signal and functions as an optical driver for the optics module. The continuous wave laser output signal is provided to the optical module via an optical cable that may have one end connected to the external light source module and the other end connected to the optical module. The continuous wave laser signal is modulated by the optical module to carry optical signals.

External light source modules are generally packaged in a standardized pluggable form factor housing that may be plugged into the faceplate panel of the optical switch. Thus, QSFP-DD and OSFP front-panel pluggable form factors are example form factor housings for an external light source module. With such pluggable module design, the external light source module may be powered-up and managed though electrical ports that may be connected to corresponding connectors on any QSFP-DD or OSFP port in the faceplate panel. However, there is a potential laser safety concern with this approach when the emitted continuous wave laser is viewable from the faceplate panel. The optical power of a fully powered laser signal from an external light source module is extremely high (e.g., +20 to +25 dBm). Thus, when the external light source module is enabled, the high optical power during the system interoperation period may cause eye safety issues. If the fiber optic cable is not properly connected to the optical module, and the external light module is activated, the resulting output laser light may potentially damage the eyes of an operator.

One solution for this problem is a hardware optical assembly that integrates the optical module and the external light source module to align the optical and electrical ports in the same direction, facing internally from the faceplate panel. Such a co-packaged system thus may avoid use of an optical jumper cable and prevent direct high optical exposure to human eyes. However, such an integrated design is costly and difficult to manufacture due to the need to design a new package as well as the inability to fit such an assembly into current form factor sockets on existing optical switches Thus, there is a need for a routine to lower laser power from an external light source module when operating in conjunction with a separate optics module. There also is a need for firmware executed by a controller allowing use of existing form factors for an external light source module without risking accidental laser emission exposure. There is also a need for a routine to limit the power of an external light source until the continuous wave laser is properly coupled to an optics module for normal operation.

SUMMARY

One disclosed example is a system for safe operation of an optical assembly. The system includes an external light module emitting a continuous wave laser signal through an output port. An optics module has an input port and a memory. The optics module generates a modulated optical signal. The memory stores the power level of the continuous wave laser signal received by the optics module. An optical jumper is provided for coupling the output port with the input port. A controller sets the external light source at a low power level and transitions the external light source to a high power level when the stored power level of the continuous wave laser signal received by the optics module exceeds a predetermined level. A communication bus is coupled between the controller and the external light source module to allow the controller to set the external light source power level.

In another implementation of the disclosed example system, the external light source module includes a form factor housing pluggable into a socket in an optical switch. In another implementation, the predetermined level is an expected input power of the continuous wave laser signal received by the optics module if the optical jumper is properly connecting the output port to the input port. In another implementation, the memory is an EEPROM. In another implementation, the low power level is a power level where the continuous wave laser signal does not damage a human eye. In another implementation, the communication bus is an I2C bus and the controller sends control signals through the communication bus to the external light source module to set the power of the continuous wave laser signal. In another implementation, the system includes a second communication bus between the controller and the optics module. The controller receives the stored power level from the memory through the second communication bus.

Another disclosed example is a method of safely using an external light source module emitting a continuous wave laser signal to an optical module that generates a modulated optical signal. The continuous wave laser signal emitted by the external light source module is set to a low power level. The continuous wave laser signal from the external light source is received by the optical module. The power of the received continuous wave laser signal received by the optical module is determined. The received power is compared to a predetermined power level via a controller. The power of the continuous wave laser signal is changed to high power if the received power exceeds the predetermined power level.

In another implementation of the disclosed example method, the predetermined power level and the determined received power from the optics module are stored to a memory of the optics module. In another implementation, the memory is an EEPROM accessible by the controller. In another implementation, the external light source module includes a form factor housing pluggable into a socket. In another implementation, the predetermined power level is the input power of the continuous wave laser received by the optical module if an optical jumper properly couples the continuous wave laser signal to the optical module. In another implementation, the low power level is at a level where the continuous wave laser signal does not damage a human eye.

Another disclosed example is an optical switch including an optics module for generating modulated optical signals. The optics module has an optical input for receiving a continuous wave laser signal. An external light source emits a continuous wave laser signal optically coupled to the optical input of the optics module. A controller is coupled to the optics module and the external light source module. The controller initially controls the power to the continuous wave laser at a low level that does not damage a human eye. The controller determines whether a received power of the continuous wave laser at the low level by the optics module is within a predetermined power level to indicate proper coupling of the laser beam signal to the optics module. The controller increases the power of the continuous wave laser at a high level to allow the optics module to transmit modulated optical signals.

In another implementation of the disclosed example optical switch, the controller is a central processing unit (CPU). In another implementation, the external light source is one of a plurality of external light sources, and the optics module is one of a plurality of optics modules. In another implementation, the optical switch has a faceplate including a socket. The external light source module includes a form factor housing plugged into the socket. In another implementation, the optics module includes a memory storing the predetermined power level and the determined received power from the optics module. In another implementation, the controller is coupled to the external light source module through an I2C bus and is coupled to the optics module through a SPI bus.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which:

FIGS. 3A-3D are part of a table of register data for the example routine to start up the external light module;

FIG. 5 is an example state diagram for the example routine in FIG. 4.

Figure 1A:
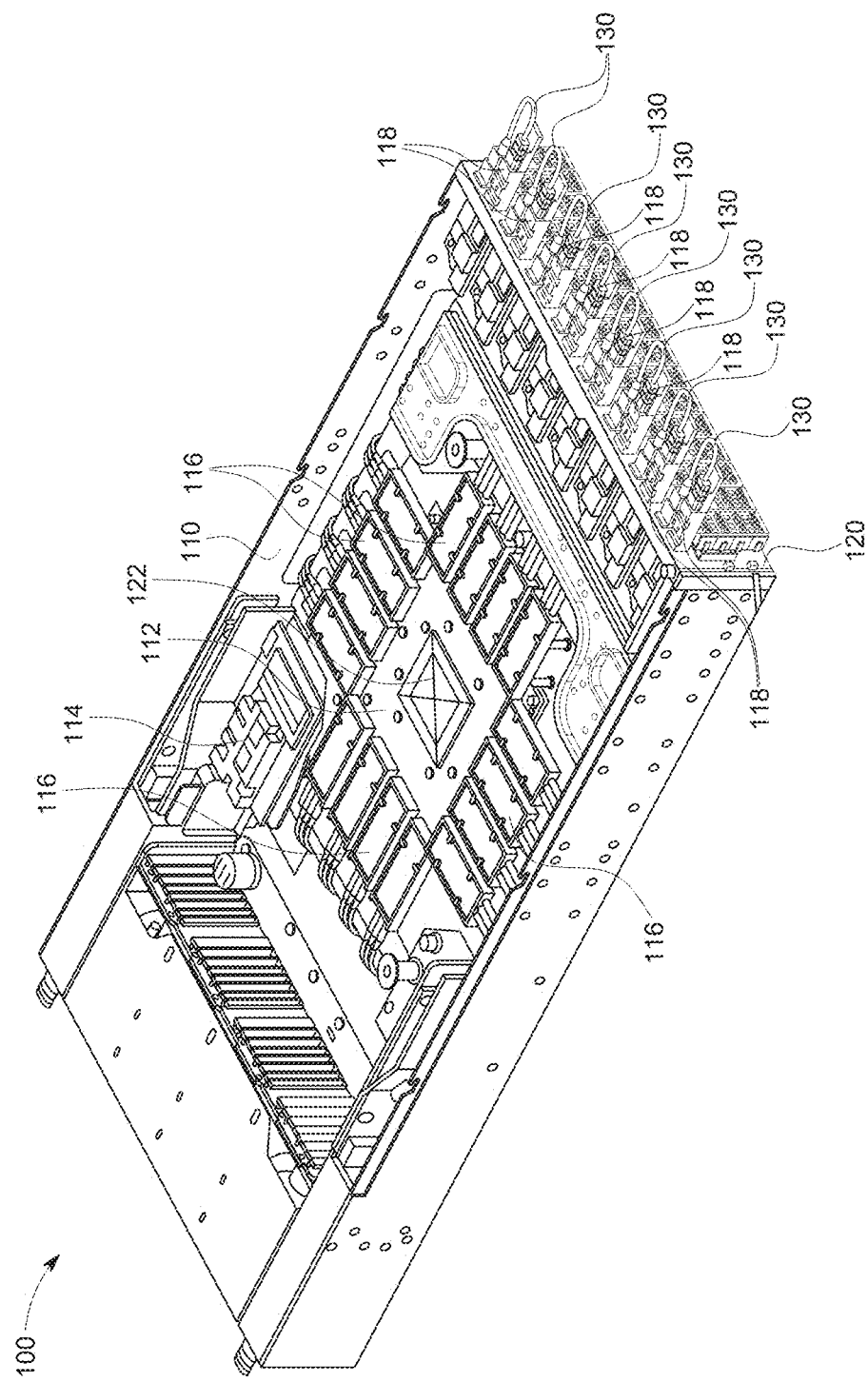
FIG. 1A is a perspective view of an optical switch that includes optics assemblies having a firmware based routine to prevent accidental high power laser emission.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION OF THE ILLUSTRATED EMBODIMENTS

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure provides a firmware routine for initialization of an external light source module that prevents full power emission of an emitted laser for safety. The firmware routine controls the optical power of the external light source module during the system initialization. The disclosed routine includes an optical power-up training loop program. This function for the optics packaged system also includes an automatic laser shutdown scheme when the fiber connector from the external light source is detected to be disconnected from the optics module. The external light source module is adjusted to full power only when the laser signal is properly received by the optics module, indicating that the optical jumper is properly connected.

The routine reduces the optical power of the external light source module in a laser safety mode. The routine determines the continuous wave laser input power received from the optics module from a value stored in memory. When the laser input power is at an expected level indicating a proper optical connection, the routine controls the external light source to increase the continuous wave laser to full power.

The firmware monitors and controls the external light source and the optics module to ensure that the laser emission is not at full power until the optical signal is properly received by the optics module, indicating proper connection of the fiber jumper. This insures eye protection from an accidental full power laser emission.

FIG. 1A shows an example optical device, which in this example is an optical switch 100. The optical switch 100 includes a housing 110 that holds support components such as a power supply, fans, memory devices, and controllers. The optical switch 100 routes optical signals transmitted and received by external networked devices such as servers. The optical switch 100 is based on a co-packaged optics assembly that manages transmitting and receiving optical signals.

The optics assembly includes a high-density organic substrate circuit board 112, a switch controller 114, and optical modules 116. In this example, there are sixteen optical modules 116 arrayed in groups of four on the circuit board 112. In this example, the switch controller 114 is central processing unit (CPU), but any suitable controller such as an application specific integrated circuit (ASIC) may be used. Each of the optical modules 116 has three fiber array ports on one side that faces outward. One of the fiber array ports transmits optical signals, while a second fiber array port receives optical signals. The third fiber array port is optically connected to an external light source module 118 to receive a continuous wave laser signal to drive the optics module 116. In this example, there are eight external light source modules 118, each corresponding to two of the optical modules 116. The external light source modules 118 are mounted on a faceplate 120. The optical modules 116 have electrical connection pins on a side facing internally opposite the side with the fiber array ports. The optical modules are arranged around an ASIC 122 that includes switching logic for routing signals between the optical modules 116 through the connection pins.

Each of the external light source modules 118 is plugged into corresponding sockets on the faceplate panel 120 of the housing 110 that supply power to the external light source modules 118. The external light source modules 118 are arranged according to two rows of sockets on the faceplate panel 120. As will be explained, each of the external light source modules 118 emit a continuous wave laser output signal. The laser output signal is provided to the respective optical modules 116 via optical fiber jumper cables 130. The optical fiber jumper cable 130 has a series of channels (for example eight channels) with one end connected to the external light source module 118. The opposite end of the cable 130 is connected to an optical splitter (not shown), that splits some of the channels for connection to one of the fiber array ports of one of the optics modules 116 and splits the other channels from the cable 130 for connection to another of the optics modules 116. Thus, each of the external light source modules 118 has one jumper cable 130 that provides the laser output signal to a respective two optical modules 116.

In this example, the external light source module 118 is a standard pluggable module that may be plugged into the corresponding sockets in the faceplate panel 120 of the switch 100. QSFP-DD and OSFP front-panel pluggable form factors are example form factor housings of the external light source module 118. With such a pluggable module design, the external light source module 118 may be powered up and managed though any of the eight QSFP-DD or OSFP sockets in the faceplate panel 120.

Figure 1B:
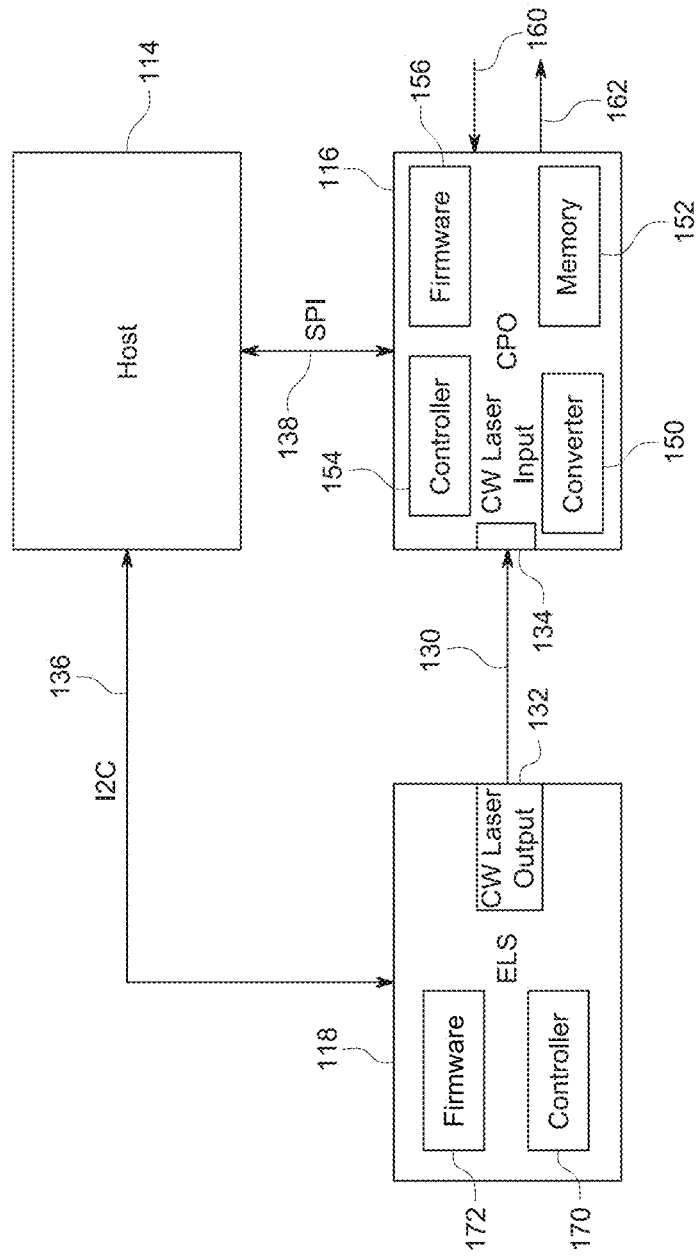
FIG. 1B is a block diagram of one of the example laser assemblies in FIG. 1A.

FIG. 1B is a block diagram of an example laser emission system that includes the controller 114, the optics module 116, and the external light source module 118 in FIG. 1A. In this example, the external light source module 118 is a high optical power provider such as a laser emitter. The external light source module 118 includes a continuous wave laser output port 132 that emits a continuous laser output signal to one end of the optical jumper cable 130. The other end of the optical jumper cable 130 is connected through an optical splitter (not shown) to a fiber array port 134 of the optics module 116. The controller 114 exchanges control signals via a bus 136 with the external light source 118. In this example, the bus 136 is an I2C bus, but any similar bus may be used. The controller 114 is in communication with the optics module 116 via a bus 138. In this example, the bus 138 is a SPI bus, but any similar bus may be used.

The optics module 116 includes a silicon photonics chip 150 that converts the continuous wave laser signal from the external light source module 118 into a pulse modulated optical output signal. The optics module 116 also includes a memory 152 that is organized in registers that provide status data for the optics system. The optics module 116 also includes a controller 154 that is operated according to firmware 156. The optics module 116 also includes a fiber optic array receiver port 160 and a fiber optic array transmission port 162. In this example, the controller 154 operates the silicon photonics chip 150 to modulate the optical output signal through the fiber optic array transmission port 162 to transmit optical signals. The external light source 118 also includes a controller 170 and firmware 172 to control the power signals to the internal laser elements that generate the continuous wave laser beam.

The controller 114 is a host that controls the emission power of the laser from the external light source 118 and the pulse modulation optical output from the optics module 116. The controller 114 obtains status data through the bus 136 from the external light source 118. The controller obtains status data through the bus 138 from the optics module 116. In this example, the controller 114 executes a power-up routine for the external light source module 118 to ensure the jumper cable 130 is properly connected before the laser beam is operated at full power.

The power-up routine executed by the controller 114 has three phases, a laser safety mode, a power measurement phase, and a power-up phase. First, the firmware 172 of external light source module 118 implements a laser safety mode to set the optical power of the laser output to a lower optical power level for eye protection. Second, the firmware 156 of the optics module 116 is able to feed back the continuous wave laser optical power reading of the laser beam received from the external light source module 118 through a memory map in the memory 152. Third, the firmware of the host system 114 implements an optical power-up training loop program to coordinate the external light source module 118 and the optics module 116 in accordance with the start-up routine. Thus, the loop will command the external light source module 118 to fully power the laser when the initialization state is complete and the lower energy laser signal received by the optics module 116 is at the expected level, indicating proper connection of the optical jumper 130.

Figure 2:
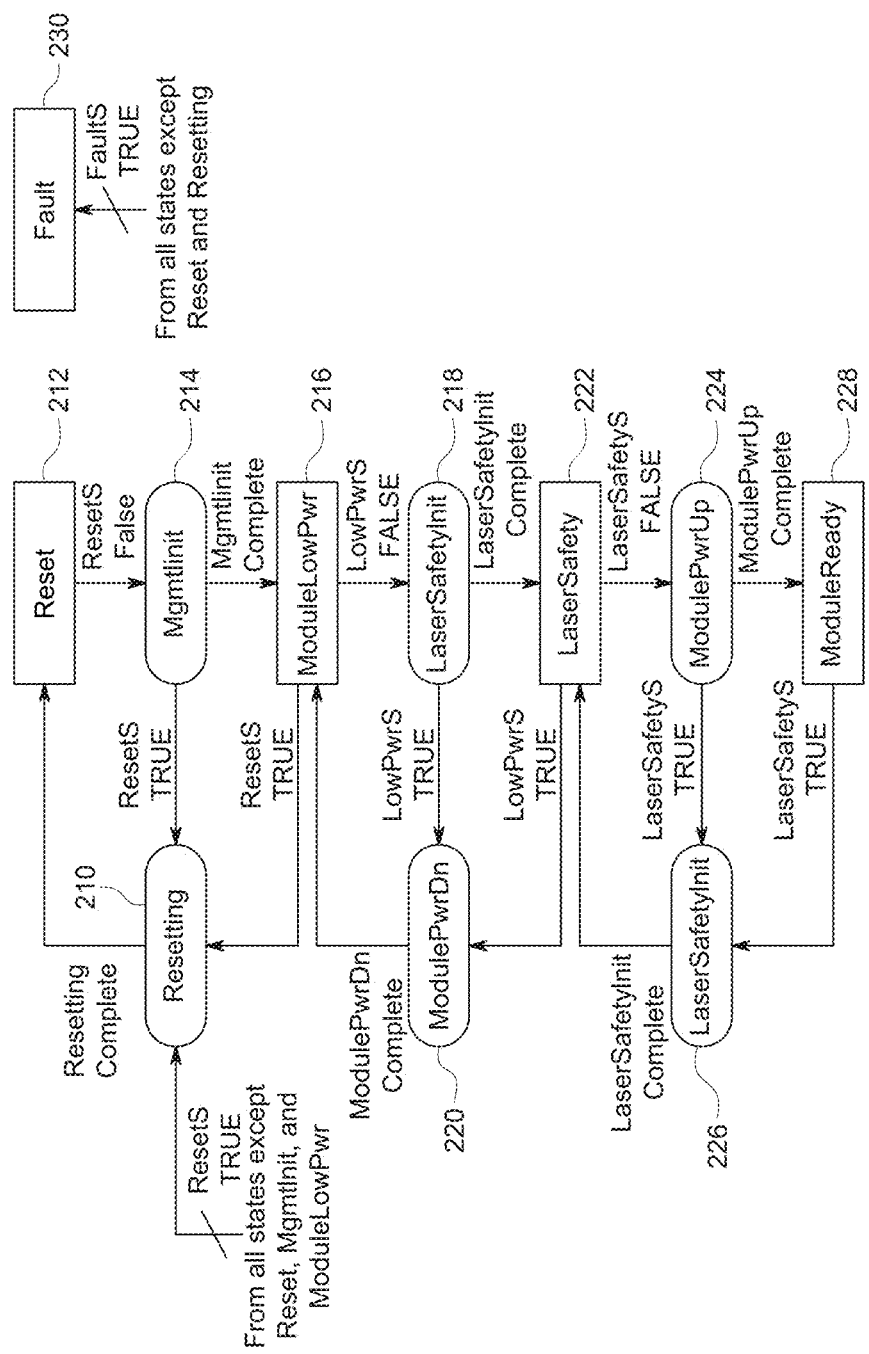
FIG. 2 is a state diagram of an example routine to prevent full power laser emission from the external light source module in FIG. 1B.

FIG. 2 is a state diagram for the process of progressing to full power-up of the optical system in FIG. 1B, including the controller 114, the optics module 116, and the external light source module 118. In FIG. 2, rectangles represent a steady state, while ovals represent a transient state. All of the states of the optics system are reset by a reset signal being true. The system in transitions to a reset state (210). The system is then in a reset state (212). The reset signal from the controller 114 to the light source module 118 is then set to false. The system then transitions to management initialization (214). Management initialization will ensure the bus 136 (FIG. 1B) is properly functioning, and signals may be communicated between the controller 114 and the external light source 118 over the bus 136. If the reset signal is true during the transition, the system reverts to the resetting state (210). If the management initialization process is complete, the system moves to a lower power state (216).

While in the lower power state (216), if the reset signal is true, the system will transition to the resetting state (210). If the lower power signal is false during the lower power state, the system will transition to the laser safety initialization state (218). The laser safety initialization state is where the external light source 118 applies lower power to the laser emitter. If during the transition to the laser safety initialization, the low power signal is set to true, the system transitions into a power down state (220). Once the power down state is complete, the system transitions to the module low power state (216). Once the laser safety initialization process is complete, the system transitions to a laser safety state (222).

When the system is in the laser safety state (222), if the low power signal is set to true, the system transitions to the module power down state (220). If the laser safety signal is set to false, the system transitions to powering up the module to full power (224). If during the transition, the laser safety signal is set to true, the system will transition to the laser safety initialization state (226). Once the initialization is complete, the system will be in the laser safety state (222). Once the module power-up is complete, the system is in a module ready state (228). During this state, if the laser safety signal is set to true, the system transitions to the laser safety initialization (226). If at any time during any state in FIG. 2, the fault signal is set to true, the system is set to a fault state (230).

In this example, the Common Management Interface System (CMIS) 4.0 management interface is used to set the state signals such as the reset signal, lower power signal, fault signal, and the laser safety signal. The laser safety state (222) for the laser safety mode in the state machine diagram 200 is embedded in the firmware 172 of the external light source module 118 in FIG. 1A. The laser safety mode is implemented in the laser safety state (222) at the external light source module state machine. The laser output power of the external light source module 118 is constrained at a lower optical power that will not cause eye damage during the laser safety state (222). When the laser safety transition signal is set to false, indicating a successful reception of the laser signal at the correct power level by the optics module 116, the firmware 172 starts to enable the optical power of the external light source module 118 to transition to a higher power level for normal operation in the module power-up state (224). When the power-up is completed, the firmware 172 of the external light source 118 is set to the module ready state (228).

The firmware 156 of the optics module 116 writes to power reading registers in the memory 152 (all in FIG. 1B) to store the power levels of the received continuous wave laser optical output from the external light source module 118. In this example, necessary registers are defined in a memory table stored in the memory 152 of the optics module 116 for the different output power levels of the laser emission received by the optics module 116. The optical power reading of the external light source module 118 is reported to the controller 114 through the bus 138 during an optical power-up training loop. The optical power reading continues to be monitored by the controller 114 during the optical power-up training loop.

FIGS. 3A-3D are a portion of a table 300 used for the optics module 116. The table 300 is stored in the memory 152 of the optics module 116 in FIG. 1B. The controller 154 of the optics module 116 in FIG. 1B may read and write data to the table 300, and send read data to the controller 114. The table 300 shows example data assignments for bytes 128-147, which are reserved for vendor data. In this example, the memory 152 is an EEPROM, but other memory devices may be used. The table 300 is one example of storing data for operating the optics module 116. The table 300 stores additional information provided by the optics module 116. The stored information is used for monitoring the received optical power from the laser and storing the alarm/warning optical power thresholds and flags.

As explained above, certain registers in the table 300 define the different power levels for the output continuous wave laser output of the external light source 118. In the table 300, the bytes 128-129 store the internally measured optical power of the laser output of the external light source 118 determined by the optics module 116. The bytes 130-137 store different laser safety threshold levels for the different alarm thresholds. The byte 138 includes bits 0-7 that may be set for various warnings and alarms. The high and low safety warning thresholds are used for the optical system during the optical power-up training stage. The high and low alarm thresholds are used for optical system during full power and normal working stage.

The bytes 139-146 store the values for the threshold values for the alarm and warnings of the power monitor under normal operation of the laser. The 0-7 bits in byte 147 may be set for various warnings and alarms for the normal operation state of the continuous wave laser. Thus, the routine will read the power level of the laser output from the optics module in bytes 128-129 and compare the value to the alarm and warning thresholds read from the bytes 130-137 in the laser safety mode. The routine will set alarms or warnings in the respective bits of byte 138 based on these comparisons. For example, when the controller 114 may detect a low alarm flag register that is triggered during normal operation. The controller 114 can decide to translate the laser safety signal to true to force the external light source module 118 into the laser safety state 222 in FIG. 2 via the I2C bus 136. Alternatively, the controller 114 can decide to translate the low power signal to true to force the external light source module 118 module into the low power state 216 in FIG. 2.

Similarly, during normal operation, the routine will read the output power of the laser in bytes 128 and 129 and compare the value to the alarm and warning thresholds read from the bytes 139-146 in the normal mode. The routine will set alarms or warnings in the respective bits of byte 147 based on these comparisons.

Figure 4:
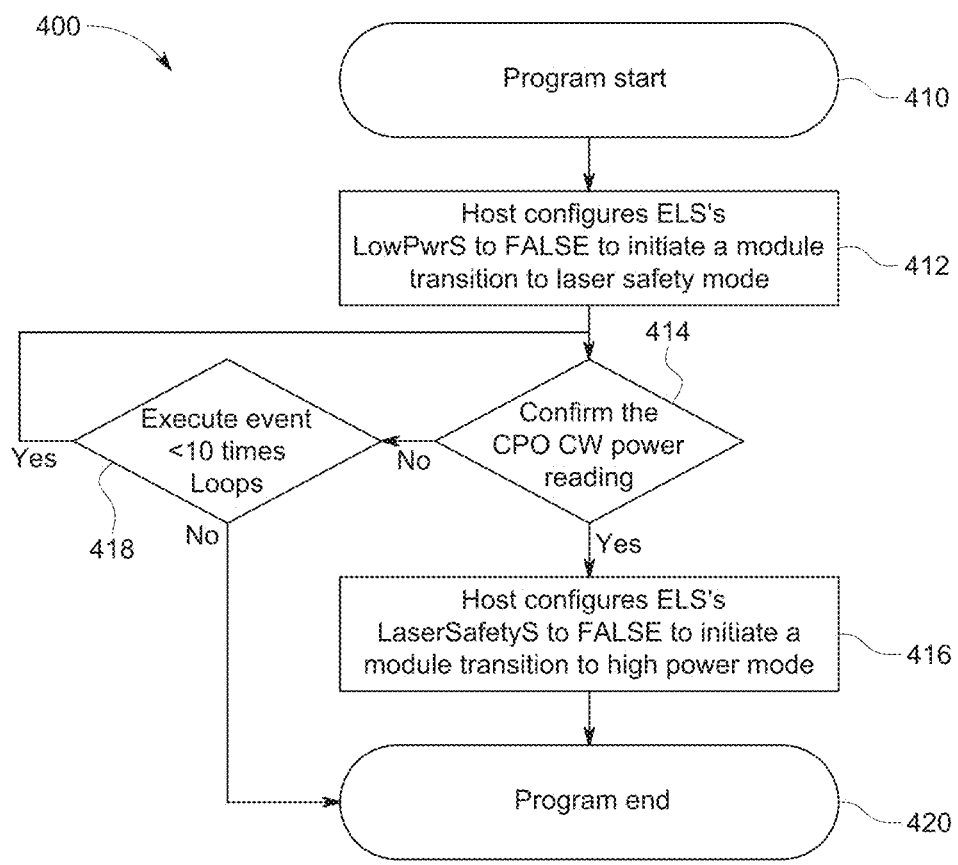
FIG. 4 is a flow diagram for the routine to provide high power from an external light source only when the laser signal is properly received from the optics module.

The flow diagram in FIG. 4 is representative of example machine readable instructions for the process of safely powering up the external light source module 118 in FIG. 1B. In this example, the machine readable instructions comprise an algorithm for execution by: (a) a processor; (b) a controller; and/or (c) one or more other suitable processing device(s). The algorithm may be embodied in software stored on tangible media such as flash memory, CD-ROM, floppy disk, hard drive, digital video (versatile) disk (DVD), or other memory devices. However, persons of ordinary skill in the art will readily appreciate that the entire algorithm and/or parts thereof can alternatively be executed by a device other than a processor and/or embodied in firmware or dedicated hardware in a well-known manner (e.g., it may be implemented by an application specific integrated circuit [ASIC]; a programmable logic device [PLD]; a field programmable logic device [FPLD]; a field programmable gate array [FPGA]; discrete logic; etc.). For example, any or all of the components of the interfaces can be implemented by software, hardware, and/or firmware. Also, some or all of the machine readable instructions represented by the flowcharts may be implemented manually. Further, although the example algorithm is described with reference to the flowchart illustrated in FIG. 4, persons of ordinary skill in the art will readily appreciate that many other methods of implementing the example machine readable instructions may alternatively be used. For example, the order of execution of the blocks may be changed, and/or some of the blocks described may be changed, eliminated, or combined.

In this example, the program starts on power-up (410). The routine executed by the controller 114 in FIG. 1B configures the low power signal to false to initiate the transition to the laser safety mode (412). The external light source 118 is set to the laser safety mode. In this example, the output power of the continuous wave laser is kept at 3 mW power in the lower power state. The optics module 116 reports the receiving power value to the CMIS (Common Management Interface System) via the SPI bus 138 when the continuous wave laser optical power level is read from the appropriate registers in the memory 152.

The host controller 114 checks whether the power of the received laser output is at or below the expected low power level. If the receiving power is within the specification low power level, the host controller 114 sets the laser safety signal as false by the Inter-Integrated Circuit (I2C) bus 136 to the external light source module 118 (416). If the receiving power is not within the specification, the laser safety state is retained for the external light source module 118 keeping the laser at the current power level. The external light source power is then checked 10 times in this example, and the power reading is checked against the specification power level for each time (414). If after 10 times, the output is not within the specification, the routine ends (420). If during any of the 10 checks, the power reading is within the specification (414), the laser safety signal is set as false (416).

When the laser safety transition signal is turned to false (416), the external light source 118 will start to increase the bias current to the laser emitter. This causes higher optical power for the continuous wave laser emitted by the external light source module 118. The external light source 118 will then be in the Module Ready state. If the external light source module 118 is in the Module Ready state, the routine ends. In this example, if the external light source is not in the Module Ready state, the system will generate a fault state by writing to fault registers in the external light source 118 and the optics module 116. The controller 114 may access these registers to determine the fault state of the optics module 116 and the external light source 118.

FIG. 5 is a diagram showing the different actions and state machine modes for the routine to safely power-up the external light source 118. The diagram shows the actions of the host controller 114, and the actions of the external light source 118, and a state column 510 of the external light source. The state column 510 lists five states for the external light source 118, a lower power state 512, a laser safety initialization state 514, a laser safety mode state 516, a module power-up state 518, and a high power mode state 520.

The controller 114 initially configures the lower power signal to false to initiate a transition to the laser safety mode (530). The external light source module 118 is thus in the lower power mode 512. Once the low power signal false signal is received, the controller of the external light source 118 begins the transition to the laser safety initialization state (532). The external light source module 118 enables the laser bias current (534). The controller of the external light source module 118 then stabilizes the laser output power at the lower power (536). After the laser output power is stabilized, the controller 114 checks the state of the external light source module 118 to insure it is in the laser safety mode 516 (538).

The controller 114 checks the power reading stored in the memory of the optics module 116 in FIG. 1B and determines whether the power reading is over the power threshold read from the memory (540). If the reading is under the power threshold, a fault condition is determined and the external light source 118 is powered down. If the reading is over the threshold level, the controller 114 configures the laser safety signal to false to initiate the transition of the external light source 118 to high power mode (542). The controller of the external light source 118 receives the laser transition signal false value and transitions to the module power-up state 518 (544). The controller 114 causes the external light source module 118 to increase the bias current to the high power mode (546). The controller 114 sets the module state changed flag to 1 when the module is ready, and stabilizes the laser output power to the higher power (548). The external light source module 118 then enters the high power mode state 520. The controller of the external light source module 118 receives the flag and indicates completion of the transition to the high power mode (550). The controller then detects the assertion of an interrupt and reads all interrupt flag registers, which de-asserts the interrupt (550).

As used in this application, the terms "component," "module," "system," or the like generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution, and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art.

Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

What is claimed is:

1. A system for safe operation of an optical assembly, the system comprising:
   an external light module emitting a continuous wave laser signal through an output port;
   an optics module having an input port and a memory, the optics module generating a modulated optical signal, wherein the memory stores the power level of the continuous wave laser signal received by the optics module;
   an optical jumper for coupling the output port with the input port;
   a controller coupled to the optics module, the controller operable receive a signal of the stored power level from the optics module in a first communication protocol over a first communication bus, the controller further operable to set the external light source at a low power level and transition the external light source to a high power level when the stored power level of the continuous wave laser signal received by the optics module exceeds a predetermined level; and
   a second communication bus coupled between the controller and the external light source module to allow the controller to set the external light source power level via a second communication protocol.

2. The system of claim 1, wherein the external light source module includes a form factor housing pluggable into a socket in an optical switch.

3. The system of claim 1, wherein the predetermined level is an expected input power of the continuous wave laser signal received by the optics module if the optical jumper is properly connecting the output port to the input port.

4. The system of claim 1, wherein the memory is an EEPROM.

5. The system of claim 1, wherein the low power level is a power level where the continuous wave laser signal does not damage a human eye.

6. The system of claim 1, wherein the first communication bus is an SPI bus.

7. The system of claim 1, wherein the second communication bus is an I2C bus.

8. The system of claim 1, wherein the optics module includes an optical transmission port, an optical receiver port, the optics module generates a modulated optical signal from the continuous wave laser signal received at the optical input and modulates optical signals transmitted through the transmission port and received optical signals from the optical receiver port.

9. A method of safely using an external light source module emitting a continuous wave laser signal to an input port of an optical module that generates a modulated optical signal, the method comprising:
   setting the continuous wave laser signal emitted by the external light source module to a low power level;
   receiving the continuous wave laser signal from the external light source by the input port of the optical module;
   determining the power of the received continuous wave laser signal received by the optical module;
   sending the power of the received continuous wave laser signal to a controller via a first communication protocol;
   comparing the received power to a predetermined power level via the controller; and
   changing the power of the continuous wave laser signal to high power via a second communication protocol if the received power exceeds the predetermined power level.

10. The method of claim 9, further comprising storing the predetermined power level, and the determined received power from the optics module, to a memory of the optics module.

11. The method of claim 10, wherein the memory is an EEPROM accessible by the controller.

12. The method of claim 9, wherein the external light source module includes a form factor housing pluggable into a socket.

13. The method of claim 9, wherein the predetermined power level is the input power of the continuous wave laser received by the optical module if an optical jumper properly couples the continuous wave laser signal to the optical module.

14. The method of claim 9, wherein the low power level is at a level where the continuous wave laser signal does not damage a human eye.

15. The method of claim 9, wherein the first communication protocol is SPI and the second communication protocol is I2C.

16. An optical switch comprising:
   an optics module for generating modulated optical signals, the optics module having an optical input for receiving a continuous wave laser signal, an optical transmission port, an optical receiver port, and a photonics chip, wherein the photonics chip generates a modulated optical signal from the continuous wave laser signal received at the optical input and modulates optical signals transmitted through the transmission port and received optical signals from the optical receiver port;
   an external light source emitting a continuous wave laser signal optically coupled to the optical input of the optics module; and
   a controller coupled to the optics module via a first communication bus and the external light source module via a second communication bus, wherein the controller is operable to:
   initially control the power to the continuous wave laser signal at a low level that does not damage a human eye via sending a signal via the second communication bus;
   receive a power level from the optics module via the first communication bus;
   determine whether a received power of the continuous wave laser signal at the low level by the optics module is within a predetermined power level to indicate proper coupling of the continuous wave laser signal to the optics module; and send a signal via the first communication bus to increase the power of the continuous wave laser signal at a high level to allow the optics module to transmit modulated optical signals.

17. The optical switch of claim 16, wherein the controller is a central processing unit.

18. The optical switch of claim 16, wherein the external light source is one of a plurality of external light sources, and the optics module is one of a plurality of optics modules.

19. The optical switch of claim 16, further comprising a faceplate including a socket, wherein the external light source module includes a form factor housing plugged into the socket.

20. The optical switch of claim 16, wherein the optics module includes a memory storing the predetermined power level and the determined received power from the optics module.

21. The optical switch of claim 16, wherein the first communication bus is a SPI bus and the second communication bus is an I2C bus.

* * * * *